(12) United States Patent
Brickell et al.

(10) Patent No.: US 8,831,787 B2
(45) Date of Patent: Sep. 9, 2014

(54) POWER SENSOR

(75) Inventors: Christopher Gavin Brickell, Docklands (AU); Scott Jeffrey Farrell, Seattle, WA (US)

(73) Assignee: SafeWorks, LLC, Tukwila, WA (US)

( * ) Notice: Subject to any disclaimer, the term of this patent is extended or adjusted under 35 U.S.C. 154(b) by 1082 days.

(21) Appl. No.: 12/999,042

(22) PCT Filed: Nov. 26, 2008

(86) PCT No.: PCT/US2008/084961
§ 371 (c)(1),
(2), (4) Date: Mar. 28, 2011

(87) PCT Pub. No.: WO2009/070725
PCT Pub. Date: Jun. 4, 2009

(65) Prior Publication Data
US 2011/0184560 A1 Jul. 28, 2011

Related U.S. Application Data

(60) Provisional application No. 60/990,194, filed on Nov. 26, 2007.

(51) Int. Cl.
| | |
|---|---|
| G05D 13/00 | (2006.01) |
| G05D 3/12 | (2006.01) |
| G05D 5/00 | (2006.01) |
| G05D 11/00 | (2006.01) |
| B66C 13/06 | (2006.01) |
| B66C 13/16 | (2006.01) |
| B66C 13/12 | (2006.01) |
| B66C 15/06 | (2006.01) |
| G01R 21/06 | (2006.01) |

(52) U.S. Cl.
CPC ................. *B66C 13/16* (2013.01); *G01R 21/06* (2013.01)
USPC ........... 700/292; 700/304; 212/272; 212/278; 212/284

(58) Field of Classification Search
USPC .............. 700/17, 83, 292, 304; 212/272, 278, 212/284
See application file for complete search history.

(56) References Cited

U.S. PATENT DOCUMENTS 4,068,773 A * 1/1978 Downing et al. ............. 414/636
4,157,736 A * 6/1979 Carbert ........................... 173/11

(Continued)

FOREIGN PATENT DOCUMENTS

| EP | 0222569 | 5/1987 |
|---|---|---|
| JP | S62260570 A | 11/1987 |

(Continued)

OTHER PUBLICATIONS

International Patent Application No. PCT/US2008/084961: International Search Report dated Jun. 30, 2009, 3 pages.

*Primary Examiner* — Ronald Hartman, Jr.
(74) *Attorney, Agent, or Firm* — Baker & Hostetler LLP

(57) ABSTRACT

Disclosed is an apparatus, system, and method for sensing the current supplied to a motorized hoist for raising a maintenance platform and providing an estimate of the operating status of the motor, for example, as stopped, starting, stalled or operating as expected. In various embodiments, measures of voltage and current may be used to determine the operating condition of the hoist and to estimate the magnitude of the applied load. Unintended modes of operation can then be determined so that the conditions can be indicated to the operator and protective measures taken.

19 Claims, 8 Drawing Sheets

(56) References Cited

U.S. PATENT DOCUMENTS

| | | | |
|---|---|---|---|
| 4,216,868 A * | 8/1980 | Geppert | 212/278 |
| 4,587,509 A | 5/1986 | Pitt et al. | |
| 4,616,207 A | 10/1986 | Knapp, Jr. et al. | |
| 4,732,286 A * | 3/1988 | Koenig | 212/278 |
| 4,787,524 A * | 11/1988 | Cobb et al. | 212/278 |
| 4,833,380 A * | 5/1989 | Magee | 318/484 |
| 4,953,053 A * | 8/1990 | Pratt | 361/31 |
| 5,265,741 A * | 11/1993 | Shimizu et al. | 212/177 |
| 5,350,076 A * | 9/1994 | Kalan | 212/315 |
| 5,859,373 A * | 1/1999 | Munzebrock et al. | 73/862.68 |
| 5,896,257 A | 4/1999 | Takahashi | |
| 6,130,599 A | 10/2000 | Juds et al. | |
| 6,271,656 B1 | 8/2001 | Juds et al. | |
| 6,527,130 B2 * | 3/2003 | Ruddy | 212/278 |
| 6,543,300 B2 * | 4/2003 | Kiviniitty | 73/862.393 |
| 6,614,198 B2 * | 9/2003 | Vaisanen | 318/434 |
| 6,642,704 B2 | 11/2003 | Hastings et al. | |
| 6,655,662 B2 * | 12/2003 | Kemppainen | 254/275 |
| 6,731,105 B1 | 5/2004 | Hoyle et al. | |
| 6,966,544 B2 | 11/2005 | McCormick et al. | |
| 6,994,223 B1 * | 2/2006 | Edgar et al. | 212/270 |
| 7,564,662 B2 * | 7/2009 | Zhang et al. | 361/20 |
| 7,677,401 B2 * | 3/2010 | Rudy | 212/270 |
| 2001/0032826 A1 * | 10/2001 | Nishikino et al. | 212/278 |
| 2002/0040609 A1 * | 4/2002 | Kiviniitty | 73/862.393 |
| 2002/0144862 A1 * | 10/2002 | Engvall et al. | 182/18 |
| 2002/0144968 A1 * | 10/2002 | Ruddy | 212/278 |
| 2003/0174064 A1 * | 9/2003 | Igarashi et al. | 340/685 |
| 2003/0205703 A1 * | 11/2003 | McCormick et al. | 254/267 |
| 2005/0192732 A1 * | 9/2005 | Narisawa et al. | 701/50 |
| 2007/0017889 A1 * | 1/2007 | Schobesberger | 212/308 |
| 2007/0274427 A1 * | 11/2007 | Jullien | 376/268 |
| 2007/0290648 A1 * | 12/2007 | Shimojo et al. | 318/565 |
| 2008/0053945 A1 * | 3/2008 | Schneider et al. | 212/276 |
| 2008/0204948 A1 * | 8/2008 | Zhang et al. | 361/20 |
| 2009/0139947 A1 * | 6/2009 | Harris et al. | 212/278 |
| 2010/0012610 A1 * | 1/2010 | Rudy | 212/270 |
| 2010/0076612 A1 * | 3/2010 | Robertson | 700/286 |
| 2010/0206831 A1 * | 8/2010 | Faust | 212/278 |
| 2011/0276261 A1 * | 11/2011 | Mizutani | 701/123 |
| 2012/0298608 A1 * | 11/2012 | Kraeutler et al. | 212/276 |

FOREIGN PATENT DOCUMENTS

| | | |
|---|---|---|
| JP | 05-301697 A | 11/1993 |
| JP | H08133686 A | 5/1996 |
| JP | H08214591 A | 8/1996 |
| JP | H10257795 A | 9/1998 |
| JP | H10331416 A | 12/1998 |
| JP | H11246182 A | 9/1999 |
| JP | 2002223591 A | 8/2002 |
| JP | 2004056997 A | 2/2004 |
| JP | 2006-502933 A | 1/2006 |
| JP | 2006-206312 A | 8/2006 |
| WO | WO 2004-035448 | 4/2004 |
| WO | WO 2009/070725 | 6/2009 |

* cited by examiner

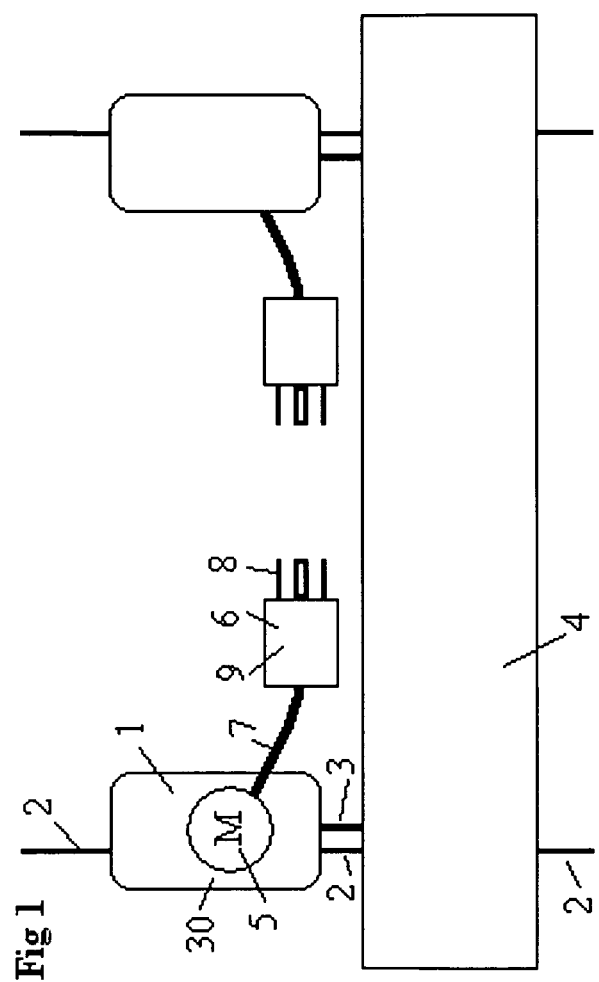

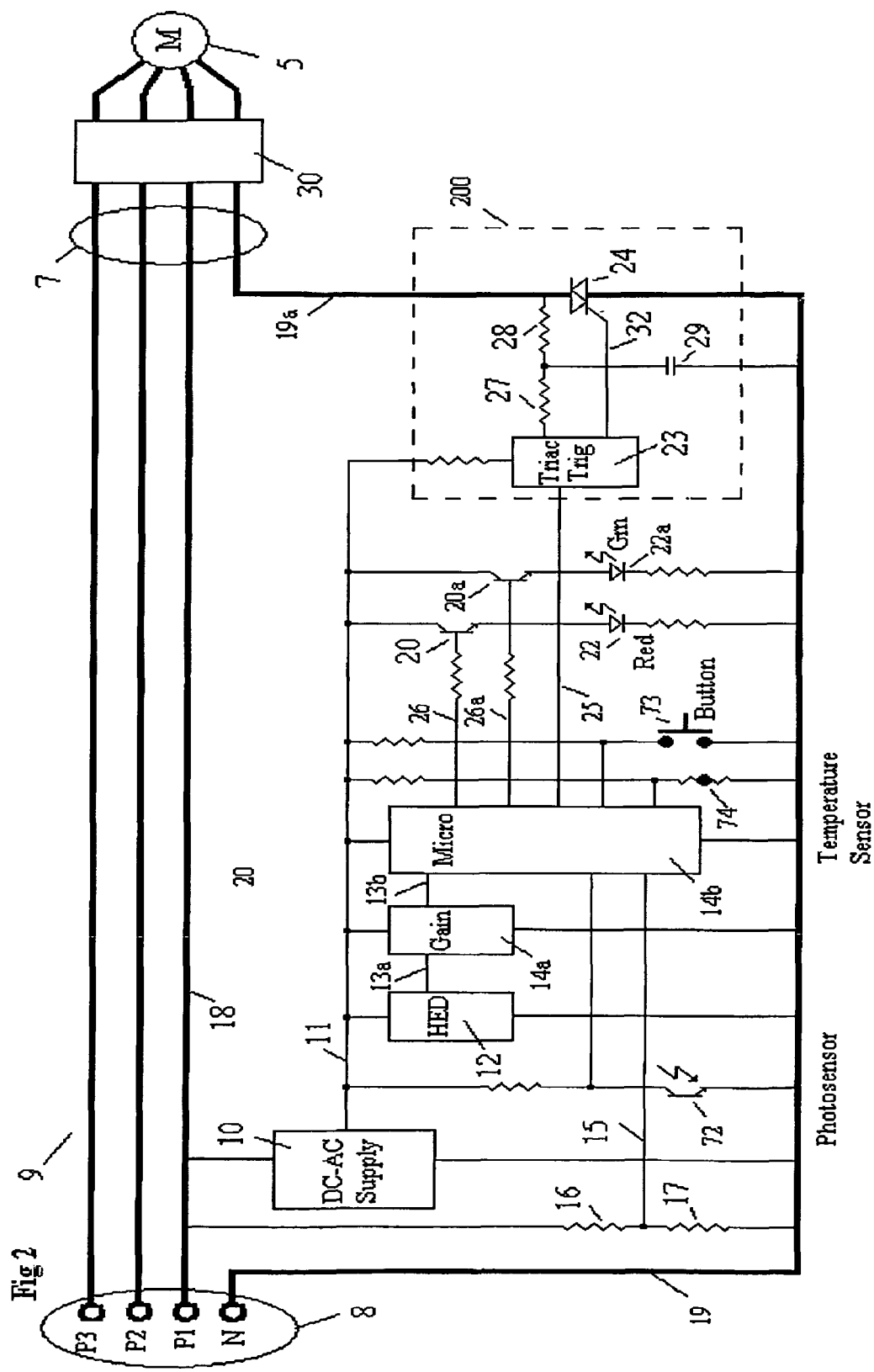

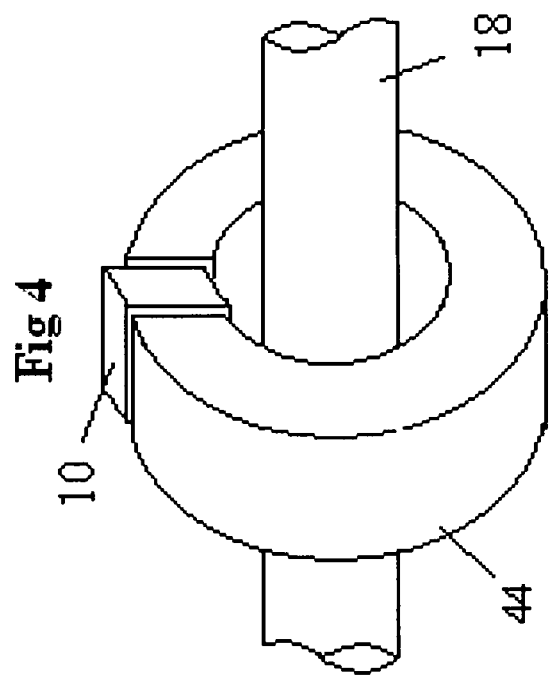
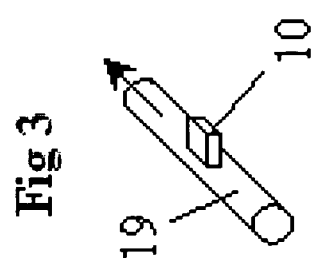

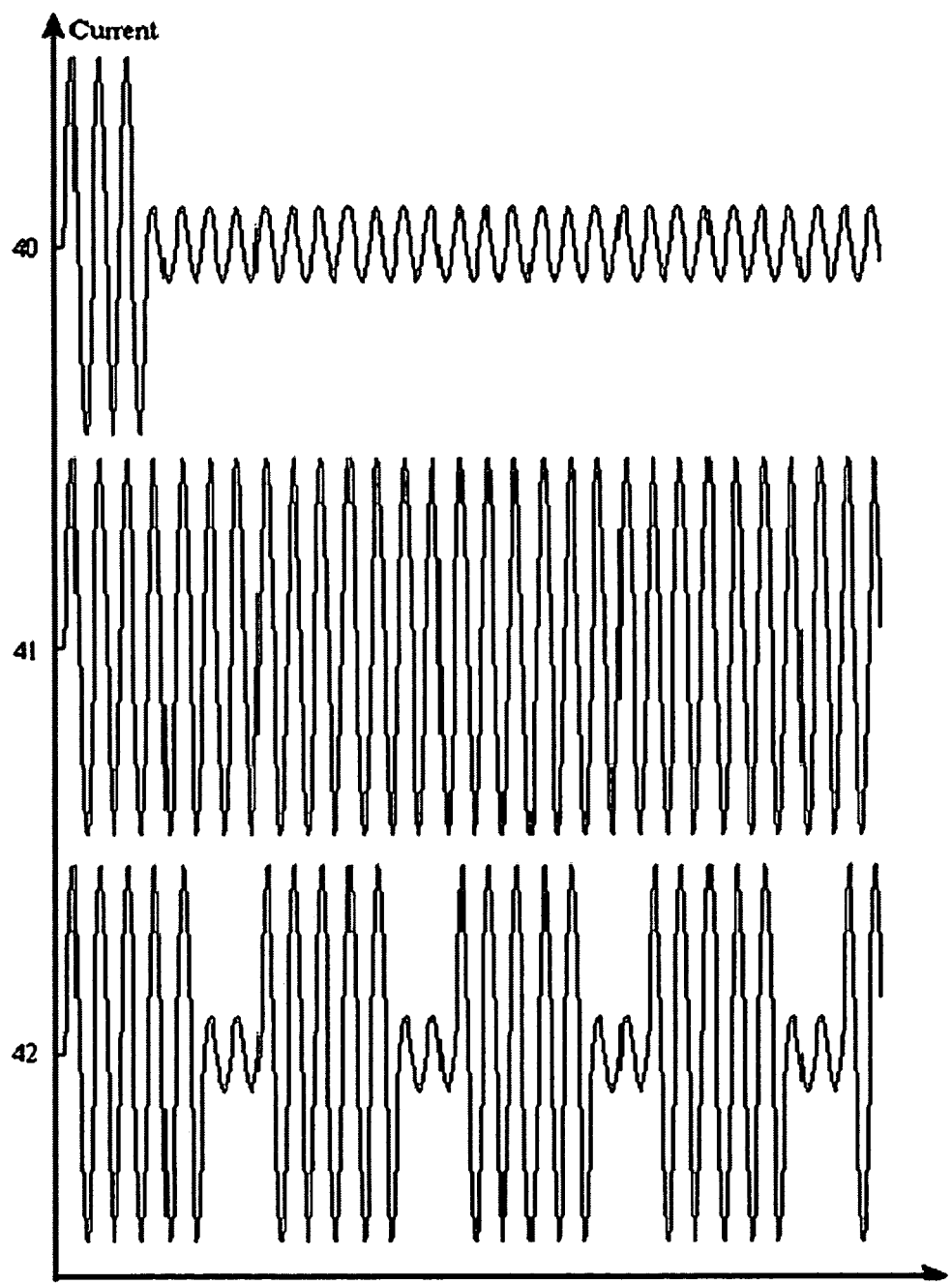

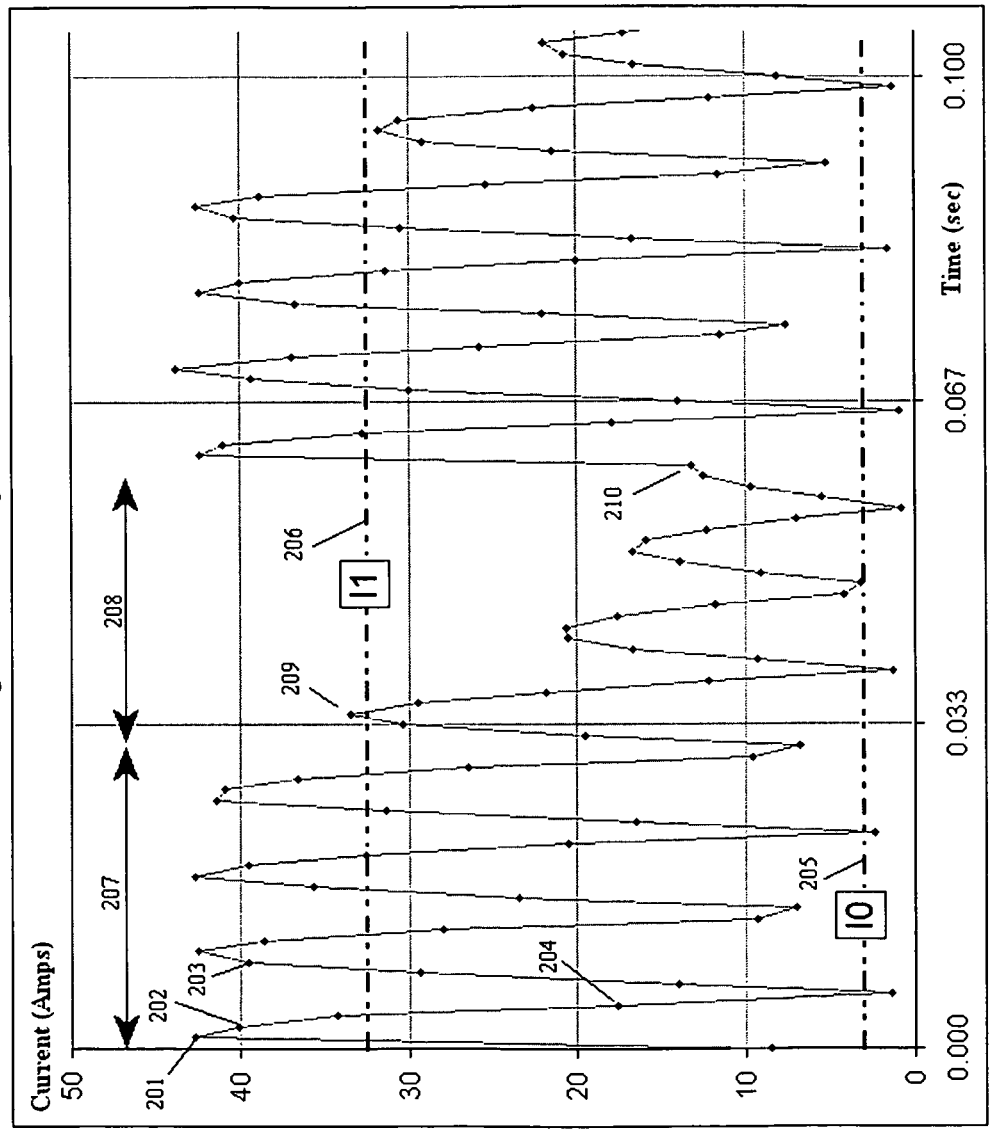
Fig 7 Current Samples

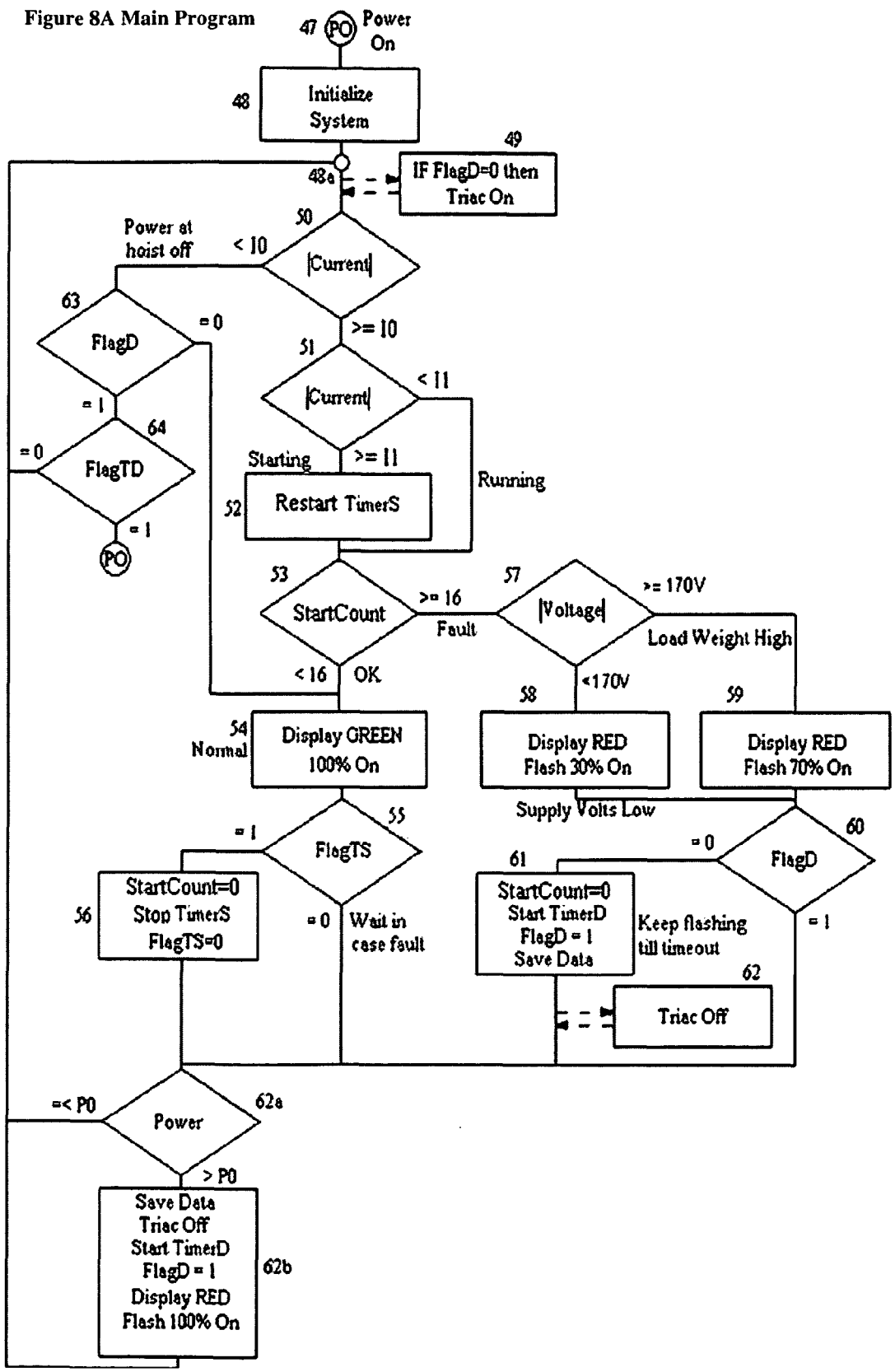
Figure 8A Main Program

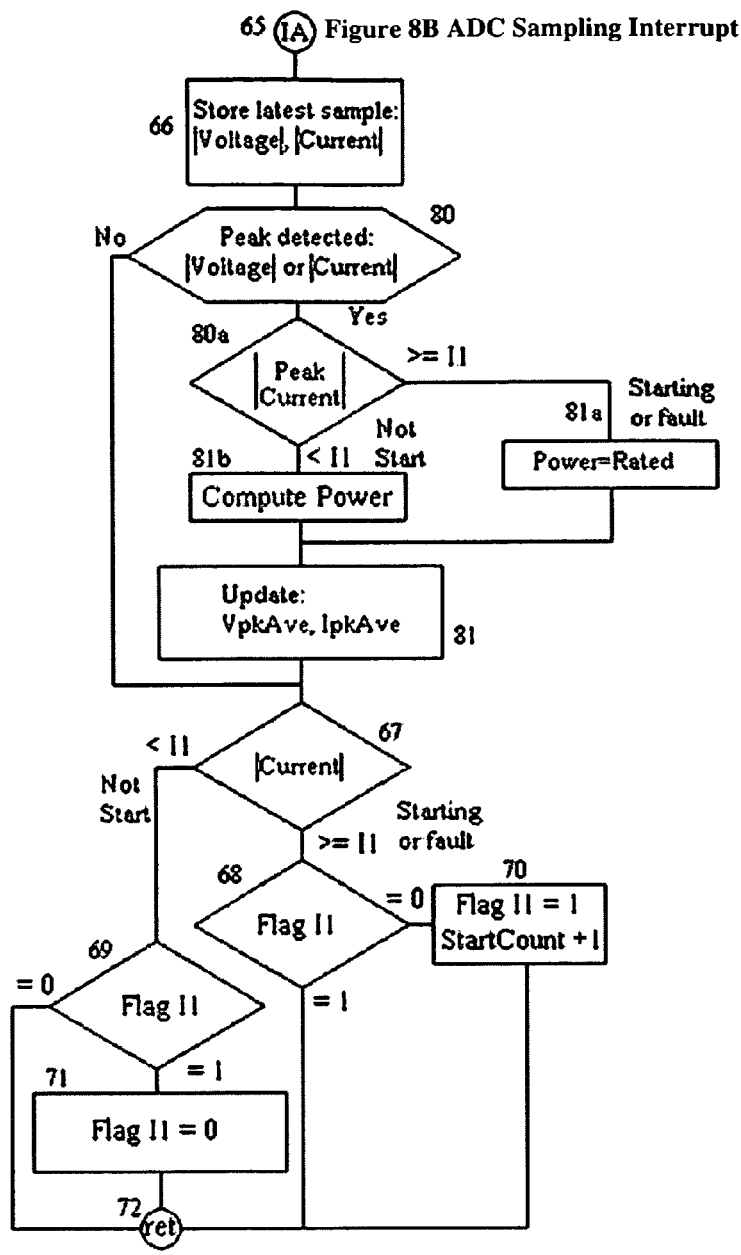
Figure 8B ADC Sampling Interrupt
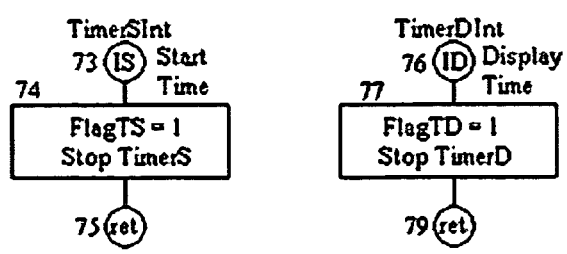
Figure 8C Timer Interrupts

POWER SENSOR

CROSS REFERENCE TO RELATED APPLICATIONS

This application is the national stage of International Application No. PCT/US2008/084961, filed Nov. 26, 2008, which claims the benefit of U.S. Application No. 60/990,194, filed Nov. 26, 2007, the entirety-disclosures of which are incorporated by reference herein.

FIELD OF THE INVENTION

This invention relates to the delivery of electrical power to hoisting devices used to elevate platforms associated with building maintenance and notification or prevention of a hazardous situation.

BACKGROUND OF THE INVENTION

Methods of measuring electric power are well known where time based current ($I_t$) and voltage ($V_t$) delivered to a load, for example an electric motor, are measured as a function of time. Then the real power $P_r$ may be computed as:

$$P_r = V_t * I_t \cos \theta$$

where $\theta$ is the phase angle between $V_t$ and $I_t$

Apparent power $P_a$ may be computed as:

$$P_a = V_r * I_r$$

where $V_r$ and $I_r$ are the root mean square (rms) values of voltage and current respectively.

Additionally many commercially available devices use direct or microprocessor methods to provide these computations.

In general, equipment used to monitor power, voltage or current supplied to a motor is used to interrupt the supply in the event that a fault condition develops. A typical example of this is a thermal overload device where the time duration of current is used to estimate the load demand conditions. Generally this estimate may be based on the value of $I_{rms}^2 t$ as a representation of energy being above a specific value to prevent continued operation.

Electrical sensors of various types are used to detect the current flowing through a conductor. Such sensors include, for example, the well known Hall Effect Device (HED) sensor that produces an output voltage indicative of the current magnitude as well as more conventional current transformer and series resistor.

In equipment such as the commercially available load monitor from Load Controls Inc. (www.loadcontrols.com), a Hall Effect Device may be used to measure delivered real power and allow a control supervisory system to manage the motor operation and protection.

Hall Effect devices for power measurement are commercially available for example the Melexis part number MLX90242 or the Allegro part number ACS712. It is also well known that by supplying the Hall Effect device with a voltage representative of $V_t$, then the signal output from the Hall Effect Device is representative of the real power.

Hall Effect Devices may be used to sense magnetic flux resulting from a flow of current through a conductor. Some of these known devices have used a flux concentrator to concentrate magnetic flux emanating from the flow of current through a conductor. U.S. Pat. Nos. 4,587,509; and 4,616,207 disclose such a current sensing apparatus.

It is also known to measure the current in a conductor with one or two appropriately placed Hall sensors that measure flux density near the conductor and to convert the same to a signal proportional to current as disclosed in U.S. Pat. No. 6,130,599, U.S. Pat. No. 6,271,656, U.S. Pat. No. 6,642,704 and U.S. Pat. No. 6,731,105.

Another example is Eaton's commercially available ECS7 microprocessor based current monitor. This product may be used to measure delivered current and allow a control supervisory system to manage the motor operation and protection.

U.S. Pat. No. 6,642,704 discloses a current sensor assembly that maintains a pair of magnetic field detectors parallel to one another and closely disposed to an electronic circuit card. Furthermore, the magnetic field detectors are selectively adjustable in order to be attached to a variety of electrical power conductors.

Measurement of current is used in many other situations for a variety of purposes including detection of potential or actual faulty operating conditions of a drum hoist such as overload, or for detection of a fault internal to a hoisting motor such as U.S. Pat. No. 6,966,544 titled "Hoist Apparatus" which applies to a drum hoist. A further example is found in U.S. Pat. No. 5,896,257 titled "Two Sensors for Over-Current Protection and Current Sensing Configuration Motor Control" which requires multiple current sensors to completely characterize motor operating conditions.

SUMMARY OF THE INVENTION

This invention relates specifically to the management of power delivered to electric motorized hoisting devices closely associated with platforms used for building maintenance, and to provide advice to the equipment operator of a potentially hazardous operating condition such as a gross overload of the platform, or attempting to operate the hoist where there is insufficient voltage to adequately and safely operate the hoist. Optionally the hoisting device may be shut down in the event that such an undesirable operating condition is present. In either case there is potential for a fault to develop with the hoist or its components to prevent further operation of the hoist that could lead to hazard or to a need to call emergency services for provision of rescue for the operators trapped on the platform while suspended at height on the outside of a building.

In this invention it is not explicitly provided that over-current or over-voltage conditions are included. However, detection of these conditions could readily be included and appropriate action initiated.

Typically, one or more drum or traction type hoists are attached to a platform, and powered from a building connected power source. Frequently there is a long interconnecting cord associated with the delivery of electric power and when the hoisting motors are started to raise the platform, the high torque required to accelerate the dead load, nominally 1000 lbs and hence high starting current, may cause excessive voltage drop in the cord resulting in insufficient voltage at the motor to enable it to reach the normal operating speed. Additionally, since motors are generally torque-limited, if high weight of the platform and its loading, combined with a lower starting voltage that is insufficient to correctly start the motor, then there is potential for the motor to remain in the high current starting condition, or alternatively to cycle between the higher torque starting condition to the lower torque operating condition, depending on motor type. This unintended high-low-high- . . . current or cycling condition typically applies to capacitor start type induction motors.

The consequence of the described unintended condition is for damage to occur to the motor, its associated components, or the platform and to develop a consequential hazard for the user.

In this invention, sensing of the current supplied to the motor on a single line is used to provide a realistic estimate of the operating status of the motor as stopped, starting, stalled or running as expected. It is known that for a three phase motor a more accurate estimate may be achieved by measuring current in two or more leads, however for the purpose disclosed in this invention using one lead does not confer any disadvantages.

Current sensing is done preferably with a Hall Effect Device (HED) which is responsive to the magnetic field on a conductor being proportional to the current through the conductor. Alternatives for current sensing may also be used such as current transformer, GMR device, series resistance, etc. However the HED provides the advantage of low cost, small size and signal isolation and is the choice for sensing in most devices at the present time where absolute accuracy is less critical.

The HED may also be configured to provide a measure representative of real power delivered to the motor: if the voltage supplied to the HED is representative of the instantaneous voltage supplied to the motor, and if the magnetic field imposed upon the HED is proportional to the instantaneous current through the motor, then the HED will implicitly multiply the two signals and the output from the HED is proportional to real power as expressed in the equation above.

In this invention, measures of voltage and current are used to determine the operating condition of the hoist and to estimate the magnitude of the applied load.

The improvements disclosed in this invention relate to a system for detection of unintended modes of operation of the hoisting system and to provide management of, protection against, or indication of such occurrences.

Interruption of supply where sustained excessive current may cause damage or a hazard is included in the capabilities. Consequently action as a non-destructive, resettable fuse is included.

BRIEF DESCRIPTION OF THE DRAWINGS

FIG. 1 shows a diagrammatic representation of a building maintenance platform with associated hoists according to the invention;

FIG. 2 shows a schematic embodiment of the power controller according to the invention;

FIG. 3 shows a diagram of the preferred relationship of the current sensor to the conductor according to the invention;

FIG. 4 shows a diagram of an alternative structure of the current sensor;

FIG. 5 shows diagrammatic waveforms characteristic of motor current according to the invention;

FIG. 7 shows diagrammatic waveforms characteristic of sampling of the motor current according to the invention;

FIGS. 8A-8C is a flow chart illustrating a preferred embodiment of the control program according to the invention.

DETAILED DESCRIPTION OF ILLUSTRATIVE EMBODIMENTS

Figure 6:
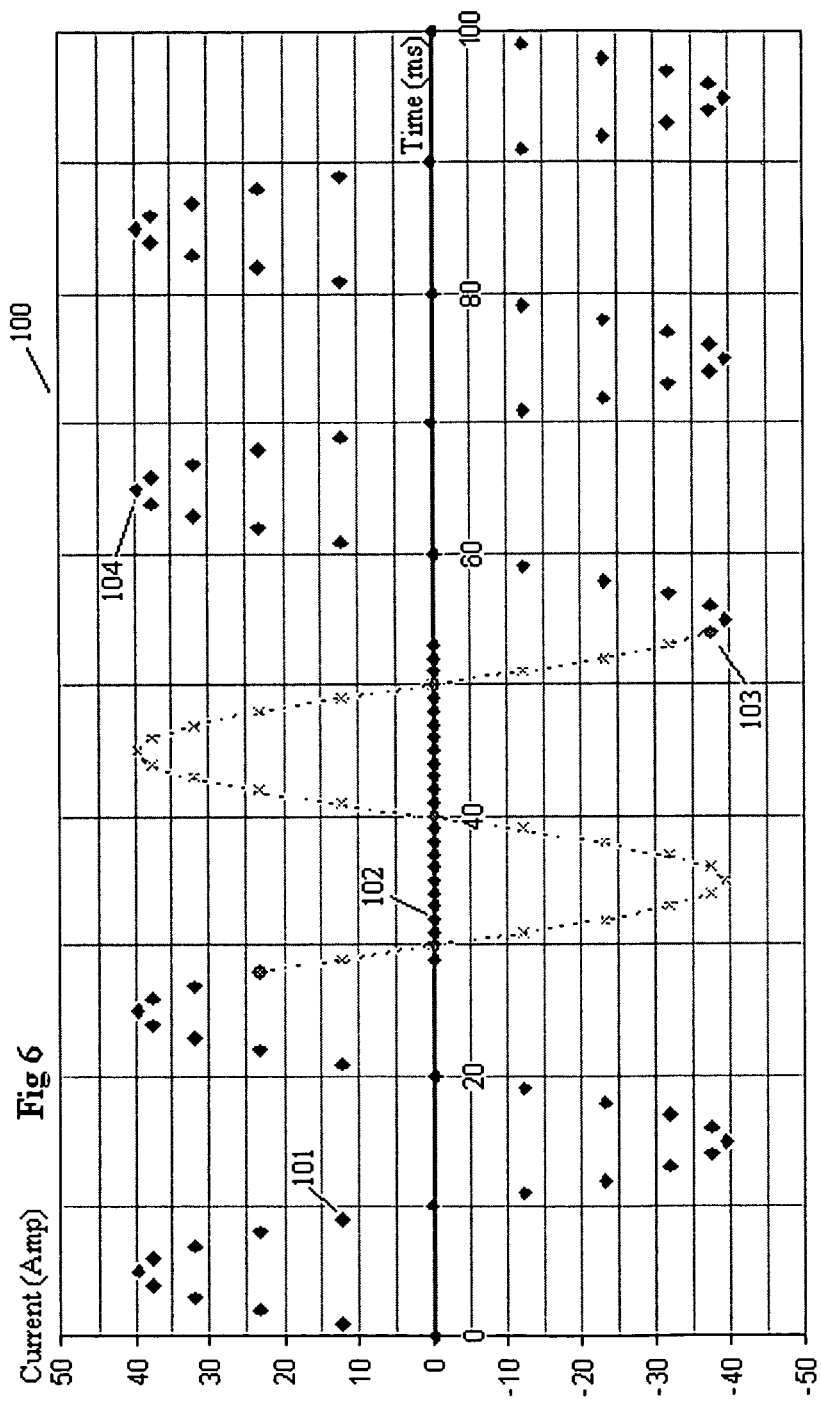
FIG. 6 shows diagrammatic waveforms characteristic of motor current according to the invention.

The overall system may be included in a power cable or plug connecting to a hoist without the requirement to modify the hoist. The hoist power sensor may also be included as a part of the hoist, or placed anywhere in the system for supplying power to the hoist.

FIG. 1 shows a platform 4 attached by a stirrups 3 to traction hoists 1 including motor switching and control 30 and motor 5. Traction hoists are referenced in this disclosure, and alternatively drum hoist may be functionally equivalent. Additionally some applications may be adequately served with a single hoist or with 2 hoists or more.

Wire ropes 2 pass through said hoists to support the total load of said platform, people and materials on it. Consequently the upward direction starting torque required of said motors is that required to accelerate and elevate said entire load reflected in each of said wire ropes. For example, a typical hoist may require a 1.2 horse power 1720 rpm motor to elevate a 1000 lb load, with a torque at the motor shaft of 75 in-lbs. The motor start current may typically be 28 Amps-rms at 208 Vac and the running current at 6 Amps-rms.

Said hoists are normally connected via cord 7 to a power supply point with plug 6 engaging plug pins 8 in a mating socket to the power supply. Alternatively said hoist may be wired permanently to a power distribution box which may include the capabilities of the invention as disclosed. Particularly the invention will be described with the hoist power controller 9 included in said cord or plug. The hoist power controller may be equally included within said hoist, or anywhere in the power supply wiring.

It is apparent from the figure that two similar hoist systems are depicted which are characteristic of long platforms. As is known, a short platform may require only a single hoist system FIG. 2 discloses the elements of said hoist power controller comprising a connection point 8 to the incoming power supply, as before via said plug pins, housing 6 including said plug pins, and said lead from said housing to said hoist.

Within said housing the preferred embodiment locates a Hall Effect Device (HED) 12 adjacent to one conductor 18 connecting source of power to said hoist. Said HED is disposed relative to said conductor such that the magnetic field resulting from current flow in said conductor intersects said HED such that the electrical signal generated in said HED on lead 13a is representative of current flow. The HED may be placed adjacent to any of the conductors carrying current to the hoist. Also arrangements of multiple HEDs may be used for the current measurement. Further, said conductor may be integral to said HED. Alternatively other well known methods of measuring current may be used such as a current transformer or the voltage across a series resistor in a current carrying lead or including the HED in the gap of a toroidal field concentrator.

According to the well known formula based on Ampere's law, the magnitude of the magnetic field B at a distance d from the conductor carrying current I is approximated by $B=\mu_0 I/(2\pi d)$, and the direction of said magnetic field is given by the well known right hand rule. Preferably said HED has an output signal that is proportional to the magnitude of said magnetic field incident on its sensitive axis as is well known. Lead 13a bearing the signal representative of the current may be pre-processed in an anti-aliasing filter 14a prior to being input on lead 13b to the digitizing input of microprocessor 14b for and subject to analysis according to an algorithm programmed into said microprocessor. Depending on the level of signal from said HED, additional signal gain may be provided in block 14a. Said filter and gain blocks may optionally be integral to said HED.

Output from said microprocessor on line 25 causes trigger device 23 to turn on triac 24 to the conducting state, or off to the non-conducting state via line 32 to said triac's gate terminal and accordingly respectively allow or inhibit current flow via lead 19, 19a to said hoist. Such use of said trigger device and said triac, or other switch devices such as for example a relay or gate turn-off device is well known for the control of current to a load such as the hoist. Associated with said triac is a conventional snubber network 28, 29 to prevent false triggering of said triac from high values of di/dt such as may develop in this motor application where an inductive load is switched.

An additional output 26 from said microprocessor may be used to operate an indicator LED 22 via transistor 20 according to said algorithm to provide indication to the operator of the state of the system. For example a steady indication of said LED may indicate the power is available and operating conditions are normal, whereas a pulsing indication may be indicative of an undesirable condition. Of course multiple indicators may be included to provide a multiplicity of indications from selected outputs from said microprocessor, and alternative indicators such as a sounder may be used with or instead of said LED. Various durations and repetition rates of said indication may be used to depict various states, for example a 30% on-time cycle for said indication with repetition rate of for example 1 second may depict a low voltage condition, and for example a 70% on-time for said indication with repetition rate of for example 1 second may depict an overloaded hoist condition. Other on-times and durations for said indication may be chosen including but not necessarily pulse width, pulse position and frequency modulation or combinations of pulse intensity and color. Further, inclusion of transmitting capability may be provided to transmit the state of said hoist power controller to a remote site. Such transmission methods are well known and may be by a separate cable, wireless, optical, power line modulation or other appropriate methods.

Included in said hoist power controller is a means 10 of deriving the required voltage, for example 5 Vdc to operate the electronic components therein. As methods of deriving said voltage are well known this will not be further described.

An additional input to said microprocessor is included on line 15 from voltage divider 16, 17. The voltage on line 15 input to a digitizing input of said microprocessor representative of voltage amplitude. The phase at line 15 relative to said current signal may be processed in said microprocessor to coordinate processing activities with zero crossing instances of said voltage with signal representative of said motor current on line 13b, thereby providing relative phase measurement between hoist current and hoist voltage. Optionally, said hoist voltage and current may be digitally processed by said algorithm to quantify real and apparent power and the time characteristics of current flow to enable or disable power to the hoist or to generate indications related to conditions of application of said hoist. As is well known to those skilled in the art, power estimated from the measures of voltage and current may be derived and evaluated to indicate the load experienced by said motor.

By using said microprocessor to process said voltage and current signals, it is possible to define an appropriate algorithm in multiple ways to implement protection of the hoist and platform or to generate indications related to conditions of application of said hoist related to use of the equipment and system. For example, the operator on the platform may receive advisory information regarding platform loading based on an estimate of the power (as previously disclosed) required to elevate the platform. Should the operating condition estimated from the measure of current and voltage estimates exceed a maximum value, then the operator could receive a warning, or if said platform is evaluated as being significant overloaded, then operation could be shut down inhibiting any further substantial use of the equipment while said overload exists.

It is also feasible to include a complex algorithm in said microprocessor provided said microprocessor has adequate capability whereby a multiplication and processing of nominally instantaneous samples representative of current and voltage is implemented to yield real power and rms values of current and voltage, otherwise the realistic assumption that voltage and current have low harmonic content and are substantially sinusoidal may be used to estimate the rms values from measurement of the peak values, with the temporal relationship of the peak values being used to estimate phase.

In this application the pattern of current through said motor is used to determine the capability of said motor to meet operating conditions and to set protective or advisory measures, and a power estimate is used to determine the degree of overload of said platform and to inhibit further powered operation.

FIG. 3 shows the preferred arrangement and relationship of the HED 12 to the conductor 18 carrying the current to the motor. By the right hand rule the direction of the magnetic field through said HED is in the downward direction, so said HED must be aligned accordingly to provide the desired indication of said current. The commercially available HED sensor type ACS712 from Allegro Microsystems, Inc provides this function as an integrated package whereby the current carrying conductor passes adjacent to the magnetic field sensing element.

FIG. 4 shows an alternative arrangement and relationship of the HED 10 to a high permeability toroidal core 44 with the conductor 18 carrying the current to the motor inserted through the inner portion of said core. Said core includes a slot in which is inserted said HED. Said core acts to enhance the magnetic field strength sensed by said HED resulting from said current in said conductor. The advantage of this arrangement is that the magnetic field incident on the HED is greater than that of FIG. 3 and the need for amplification of the signal on line 13a is reduced. Furthermore said signal amplitude may be increased proportional to the number of times said conductor is wrapped around said core as is well known.

FIG. 5 shows a time-amplitude graph of said supply current in conductor 18 representative of significant conditions of operation of said hoist. When said hoist is operated such that the load on said platform is below the maximum rated load value and the minimum said voltage is at least the lower rated voltage value, then said hoist would be expected to operate normally. Assuming the start point for said current flow is the time represented by instant 43, then graph 40 shows that said current represented on the vertical axis rises to a higher level for a period of time corresponding to the engagement of the start winding of said motor. Once said motor reaches sufficient speed then it automatically switches to the run mode and said current reduces to a lesser value which continues while said motor receives power. In the preferred embodiment of this invention, said motor is a commercially available capacitor start type motor with the start capacitor switching state by a centrifugal switch built into said motor at approximately 75% of the run speed. Generally the start torque of such a motor is greater than the torque at its run speed.

Graph 41 corresponds to an undesired condition where the platform load sufficiently exceeds the rated capacity and/or the supply voltage is lower than the minimum value required. Consequently the motor torque is insufficient to raise the load and said motor is unable to reach a speed at which said centrifugal switch changes over to discontinue said motor start mode, and said motor remains in its start condition drawing said higher current. It is an object of this invention to detect such an undesirable stalled or locked rotor condition and provide protective direction.

Graph 42 corresponds to a further undesirable condition where said motor is able to develop enough torque to accelerate to a speed above the start condition but the load is too great and/or the supply voltage is too low to sustain the lower torque run speed, consequently said motor slows down and the start condition resumes. Because of the lower torque in run mode and higher torque in start mode, said motor will cycle between the start and run conditions, generating a succession of higher current cycles. It is an object of this invention to detect such an undesirable cycling condition and provide protective direction.

FIG. 6 shows diagrammatic waveforms 100 characteristic of said motor current according to the invention where for example digital samples of the signal representative of said current as sensed by said HED are represented by the exemplar instantaneous sample 101. Depicted is a series of samples representative of the current with a section displaying no current flow as at 102 and further representative current samples resuming at 103. The algorithm embedded in the microprocessor 14b is such as to determine the level of said current and distinguish events such as periods when lower or higher current is flowing and when current is not flowing and the durations of such events preferably but not necessarily determined as the number of half cycles of higher current.

For convenience of presentation, the diagram of FIG. 6 is based on a 50 Hz waveform. Of course in the USA the frequency is 60 Hz with a period of each cycle being 16.67 ms approximately. The peak value 104 of the current at nominally 39.6 Amps corresponds to an rms current of 28 Amps which corresponds to the nominal peak expected current during start of the motor or in the locked rotor condition, and corresponding to said higher current.

In this invention, an estimate of power is made from a measure of the peak of successive half cycles of each of the current and voltage waveforms to derive the rms value as:

$$P = 0.5 * V_{peak\text{-}ave} * I_{peak\text{-}ave}$$

noting that as an example of the method for computing an averaged value for a variable X (representing $V_{peak\text{-}ave}$ or $I_{peak\text{-}ave}$), the exponential smoothing method may be economically employed. Using terms $Y_{-1}$, for the previously averaged value of X, and $X_0$ for the current sampled value of variable X, and $\alpha$ as the averaging rate term, then the current average $Y_0$ may be computed as:

$$Y_0 = Y_{-1} + \alpha(X_0 - Y_{-1})$$

then for the next computation cycle, set $Y_{-1} = Y_0$.

Alternatively, power P may be directly computed from successive digital samples of voltage v(j) and current i(j) from the known direct computation formula:

$$P = \frac{1}{N}\sum_{j=0}^{n-1} v(j) * i(j)$$

where n samples are taken, preferably as n samples per full cycle of supply voltage where n is for example 16.

It is noted that the rms method of estimating the load on said platform reflected in the measure of power in the motor may not provide sufficient sensitivity or accuracy in some applications as the phase relationships between current and voltage may change with load.

Additionally, if electronic control of said hoist motor is implemented such as for example pulse width modulation, then harmonic distortion on the supply will decrease the accuracy of the rms method. For the sake of disclosure in this invention, the measure of power may be taken as either the rms method or said direct computation method.

Should the computed power exceed a specified level during the normal running phase, for example 1,100 Watts, then said triac may be set to the off or non-conducting state as previously detailed, and thereby provide additional system protection and remove power from said hoist motor.

As a further aspect of the invention, should the sensed current exceed any of the highest levels 40, 41 or 42, by a specifiable margin then said triac may be set to the off or non-conducting state as previously detailed, and thereby provide additional system protection and remove power from said hoist motor. This action is similar to that provided by commercially available fuses and thermal overload devices. Because said triac is directly controlled by said microprocessor, various algorithms may be specified to determine the point at which said triac is turned off. For example the well known current-time curve approach may be used to set the upper limit trip point. Alternatively a simple limit, for example exceeding the nominated current in FIG. 6 of nominally 40 A-peak by a factor of 50% would set the limit at a peak current of 60 A, corresponding to an rms current limit at 42 A. Other algorithms may be software defined and implemented in said microprocessor with equal facility.

FIG. 7 demonstrates a further example of an undesirable operating condition where said motor does not develop enough torque to remain at running speed. Power is applied to said motor at time zero, and provided an operating control for said hoist is operated, said motor accelerates to running speed. Shown is four half cycles at high current during the start phase. Because the absolute value of current is used in the invention, each full cycle of current becomes two half cycles. All future references to said motor current shall be understood to reference half cycles.

As further discussed in following sections, said current is sampled digitally and each sampling instant is shown as a dot in FIG. 7, for example 201.

In this invention said current is assessed as flowing if the measure of said current exceeds reference level 205 named "I0". According exceeding level I0 corresponds to being in the operating condition.

At 201 said current reaches a peak in excess of reference level 206 named "I1". Accordingly exceeding level I1 corresponds to being in the start condition.

After duration 207 said current decreases as said motor reaches nominally 75% of full rated speed and enters the run mode as in duration 208. In this diagram said motor does not develop sufficient torque to remain in said run mode and at 210 resumes a further duration of said start mode.

This is an undesirable operating condition as the power dissipated in the motor and its current carrying components cause excess heat to be developed with consequent degradation. For example a capacitor start motor places a capacitor in series with the current flow during start. Such capacitors are generally rated for one start event per minute for a normal life of 20,000 to 50,000 starts. One of the primary failure modes resulting from excess heat development in the start capacitor is to cause drying out of the electrolyte and acceleration of ultimate failure. Normally motors include a thermal overload to prevent continued operation in the locked rotor or stalled condition where the current sustains at level typified by 207, however said cycling condition is not necessarily well protected.

It is an object of this invention to detect such an undesirable cycling condition and provide protective direction.

FIGS. 8A, 8B and 8C provide an example flowchart of a preferred control program or algorithm controlling the operation of the microprocessor 14b. Operation of the hoist power controller 9 and indicator 22 and triac power switch 24 of this disclosure are directed by software structured for example as described by said flowchart.

When power is applied, said microprocessor begins operation at 47 of said control program. Many ways of providing said control program familiar to those skilled in embedded software methods may be structured, and for example the following is one way in which such a control sequence of events may be described in broad terms.

In the description following, it is understood that the control program is in the state of operation whereby said microprocessor is sampling and digitizing the signals from said HED representative of current in line 18 and the voltage on line 15 representative of supply voltage. The rate at which said microprocessor samples said signals is sufficient to achieve a realistic estimate of said current and voltage, for example 960 times per second on a controlled and regular time basis to achieve 16 samples per cycle for 60 Hz power. Thus said sampled signals may be processed to yield representations of said current and voltage for example as the root mean square (RMS) values, or peak values over a specified time interval.

In this embodiment of said control program a periodic generator of an ADC interrupt causes the analog to digital converter inbuilt to said microprocessor to carry out said sampling of said signals. At the completion of said sampling, said samples are stored in said microprocessor or memory as the absolute value of parameters |Voltage| and |Current|, said samples representing the values of said signals at the instant of the sample. From FIG. 8C when said ADC interrupt occurs at 65, if at 80 either or both a peak of |Voltage| and |Current| is detected then at 80a, if the peak |Current| is less than specified value I1, for example a value representative of a current in line 18 of 35 Amps, then a new value of Power is computed at 81B, otherwise Power is set to the value of Rated Power for example representative of 1,000 Watts when said platform is loaded at the rated load, for example 1,000 lbs. At 81 the values of VpkAve and IpkAve are updated as the average values of the currently detected peak voltage and current respectively and said control program continues at 67. If at 80 no peak of current or voltage is detected, then said control program continues at 67.

Of course, a different implementation of said control program may use signed or another representation of said voltage and current, and also the zero crossing point of current or preferably voltage may be used to signify the boundary point of a half-cycle.

As a further alternative, the power may be computed during said start phase and subsequent decisions based thereon.

At 67 if said |Current| is greater than or equal to said specified value I1, then at 68, if parameter FlagI1 is set, point 72 is reached and said interrupt exits and said control program resumes at the point where it was interrupted, otherwise at 70, parameter FlagI1 is set and the parameter StartCount1 is incremented by 1. Point 72 is then reached and said interrupt exits and said control program resumes at the point where it was interrupted.

Alternatively at 67 if parameter |Current| is less than specified value I1 then at 69, if parameter FlagI1 is 0 (reset), point 72 is reached and said interrupt exits and said control program resumes at the point where it was interrupted, otherwise at 71 parameter FlagI1 is reset and point 72 is then reached and said interrupt exits and said control program resumes at the point where it was interrupted.

In the further description of operation of said control program two other interrupts are operative as shown in FIG. 8C as TimerSInt and TimerDInt. Under control of said microprocessor, a timer TimerS may be loaded at 52 with a specified value, for example 100, and TimerS is then enabled to independently increment said specified value to a terminal value, for example 255 at a specified constant rate over a specified time, for example 2 seconds. On reaching said terminal value, TimerS may be enabled to generate the interrupt TimerSInt and under action by said control program at 73 a parameter FlagTS is set at 74. TimerS is then inhibited from further action and said control program resumes at the point where it was interrupted. The purpose for timer TimerS is to set a maximum time over which the number of current half cycles are accumulated. Of course TimerS may perform its function by decrementing.

Similarly, under control of said microprocessor, a timer TimerD may be loaded with a specified value at 61 or 62b, for example 100, and TimerD is then enabled to independently increment said specified value to a terminal value, for example 255 at a specified constant rate. On reaching the terminal value, TimerD may be enabled to generate the interrupt TimerDInt and under action by said control program at 76 a parameter FlagTD is set at 77. TimerD is then inhibited from further action and said control program resumes at the point where it was interrupted. The purpose for timer TimerD is to set a maximum time over which indication of said undesirable condition is displayed or inhibited, or for which power to said hoist is interrupted before resuming unless such interruption requires other action for resumption. Of course TimerD may perform its function by decrementing.

By this means specific timed intervals may be provided to enable action elsewhere in said control program.

Note that TimerS and TimerD are independent of each other.

At any time while power is available, the operator of said hoist may press the up or down button on said hoist to apply power to said hoist motor 5 and cause said platform to ascend or descend respectively, whereupon said current in said line 18 (and also in the return line 19, 19a) is greater than a second specified value I0, for example a value representative of a current in line 18 of 3 Amps.

Generally, higher currents are drawn in the up direction and any current greater than parameter I0 is regarded as indicating said hoist is operating.

With reference to the main program of FIG. 8A, when said controller is powered at 47, said control program initializes said microprocessor to an initial state whereby all parameters are reset to an initial state as required for correct program execution, and all elements such as timers, ADC, input and output ports are configured for the selected mode of operation under said control program, whereafter said control program cyclically runs a loop initiated at 48a. During execution of said loop, interrupts occur which divert execution to the relevant interrupt routine, which upon completion return execution to the point where the interrupt occurred. Such interrupt routines are structured to prevent loss of information in the interrupted sequence.

While not shown explicitly, it is understood that if said optional power switch triac and associated components 200 in FIG. 2 are included, then said control program includes actions at 49 and 62 such that power delivered to said hoist may be turned on at 49 to provide power to said hoist and turned off at 62 to interrupt power to said hoist, otherwise power remains supplied to said hoist unless externally removed, irrespective of operating conditions.

In said loop said current sample |Current| is compared to said level I0, and if greater than or equal to I0, |Current| is compared to said specified value I1 and if greater than or equal to said specified value I1 said timer TimerS is restarted by reloading said specified value. TimerS is such that after a specified interval, for example 2 seconds, said interrupt TimerSInt is generated as previously described, otherwise said control program continues at 53. If at 51 |Current| is less than said specified value I1 the timer is not restarted and is left to time out.

As previously described, parameter StartCount is a count of the number of current cycles in excess of said specified value I1 and is checked at 53. If StartCount is less than a specified value, for example 16 representative of 8 full cycles of start mode, then normal operation is assumed, and at 54 an indicator 22*a* displays green and at 55 parameter FlagTS is assessed. If FlagTS is set then at 56 any accumulated value of parameter StartCount is cleared, said timer TimerTS is stopped and FlagTS is cleared prior to continuance at 48*a* after power is assessed as less than or equal to the limit value P0 at 62*a*, for example 1,100 Watts, otherwise the TimerTS is left running and StartCount is left accumulating as said loop at 48*a* resumes after power is assessed as less than the limit value P0 at 62*a*, for example 1,100 Watts, corresponding to the normal operating mode with short motor start times and sustained run operation.

If at 62*a* power is assessed as greater than or equal to said limit value P0, then the data related to the condition is saved in memory, preferably non-volatile memory, said triac is switched off to interrupt power supply to said motor, timer TimerD is started, parameter FlagD is set and the indicator 22 is set to display continuous red color. The purpose of TimerD is to interrupt power supply to said motor for a specified period, for example 30 seconds before power to said motor resumes. Alternatively the power may be interrupted until intervention by an operator occurs to provide remedial action.

Note that as one indicator of 22 or 22*a* is enabled, it is implied in this disclosure that the other indicator is disabled. Also it is noted that there are indicators commercially available that display in different modes as the input level is set to a different level.

If at 53 during execution in said loop, the number of said current cycles is evaluated as equaling or exceeding a value, for example 16, the next executed function is 57. By this means said control program may detect an undesirable operating state such as said motor torque being inadequate to accelerate the speed to the desired operating speed as demonstrated by an excessive number of half cycles of start current. Furthermore at 57, if the absolute value of the supply voltage is evaluated as less than a specified value, for example less than 170 Volts rms, then said undesired condition may be expressed as the supply voltage to the system being too low and an indication made of this condition by flashing a red display light 22 with a low ratio at 58, for example 30% on to off time with a flash period for example of 1 second. Or if said supply voltage is evaluated as greater or equal to said specified value, then said undesired condition may be expressed as the weight on the platform being too high and an indication made of this condition by flashing a red display light 22 with a high ratio at 59, for example 70% on to off time with a flash period for example of 1 second. While only one said display light is shown, it is known that a multiplicity of lights or indicators may be deployed to display information as required. At 53 if StartCount is less than said specified value then said program continues as described above.

Following execution through 58 or 59 corresponding to an undesired condition, if at 60 parameter FlagD is not set, then at 61 parameters StartCount is cleared and FlagD is set. Also timer TimerD with duration for example 30 seconds is started then optionally power may be removed at 62 from the hoist by removing said trigger enable signal from said microprocessor on line 25. This causes said triac to stop conducting at the next zero crossing point of said current. Also at 61 data related to said undesirable condition may be stored in non-volatile memory for later recall. Otherwise at 60 if FlagD is not set then the loop resumes at 48*a* after power is assessed as less than the limit value P0 at 62*a*, for example 1,100 Watts.

At 50 provided parameter |Current| is less than I0 then power at said motor is off and provided parameter FlagD is not set then said control program continues at 54. Otherwise if FlagD is set corresponding to an indication of an undesirable condition, then at 64 if parameter FlagTD is set corresponding to the maximum time for indication of an undesirable condition being reached, said control program resets at 47 thereby clearing all parameters and indicators to the initial state and resuming operation. Data stored at 61 in the non-volatile memory may not be cleared by such action of during initial powering of said power sensor according to the operating mode of said controller. If at 64 FlagD is not set then said loop resumes at 48*a*.

It is of note that the execution time for said loop is relatively short, for example less than 0.1 millisecond, consequently the entire program will execute many times in a single cycle of the supply voltage.

As a further refinement in operation of said controller, it is desirable to initiate application of power to said motor in a manner as to minimize transient currents. It is well known that applying voltage to the motor at the zero crossing point of voltage supply and removing power at the zero current crossing will generally achieve the lowest transient currents and electromagnetic emissions. This capability may be included in the general design of said controller using commonly available components and methods.

As an alternative to switching off power as in "fuse" mode to said hoist when said undesirable condition is detected, by omitting the components within dotted line 200, then said lights or indicators will act as an advisory to the operator who may make a decision to cease operation as he chooses. This is analogous to the seat belt indicator in a car flashing if the car is driven without the seat belt fastened rather than disabling the car.

As a further alternative, the operator may choose an operating mode for said controller by signaling to said controller using button 73 to set said operating mode. For example successive presses of said button may alternate the advisory only mode, and said fuse mode.

With reference to FIG. 2, additional capabilities may be included in said controller to provide increased utility. To provide a means of signaling specific commands to said controller, photodetector 72 may be included. When said photodetector receives an appropriate optical signal, then said microprocessor may be configured to act according to said signal, for example to cause indicator 22 to display or transmit stored or other information corresponding to the intent of said optical signal. Such information displayed may include output from said microprocessor memory information on stored events related to operation of said hoist. An external computer or hand held device may be configured to provide such signaling capability, and may be alternatively provided by for example radio, inductive or acoustic coupling for signaling.

A further inclusion that may be incorporated in said controller is to sense temperature, for example of said triac using temperature sensor 74. A semiconductor switch has a maximum allowed operating temperature, and for a given heat dissipation capability of said triac, the time rate of change of temperature at said triac may be interpreted as representative of current through said triac thereby providing a further mechanism for assessing operating conditions in said hoisting system. The temperature sensor may be a thermistor, RTD, thermocouple, semiconductor junction, infra red device or other temperature responsive device. In this disclosure a thermistor is specified as providing the simplest integration. Also if said controller is located proximal to said motor then said temperature sensor may be use to provide information about motor temperature and further capability included in said control program to manage said motor accordingly.

If the method of this invention is applied to a motorized hoist with a 3 phase supply, then when power is removed from any one of the phases, power will also be removed from all three phases by the preventive action of a connected phase sequence relay as required by code. Accordingly only one phase is utilized in this invention, however the same principles disclosed herein may be similarly applied to more than one phase.

While current is the preferred measure of motor operation as described herein, it is also possible to use variations in voltage measured at the motor as significant of motor operation. However any variations in voltage may be dependent on the impedance of the lines between the motor and the primary supply. Also, phase variation between the voltage and current may be indicative of motor operation. Consequently measurement of current is preferred.

The foregoing detailed description has set forth various embodiments of the systems and/or processes via examples and/or operational diagrams. Insofar as such block diagrams, and/or examples contain one or more functions and/or operations, it will be understood by those within the art that each function and/or operation within such block diagrams, or examples can be implemented, individually and/or collectively, by a wide range of hardware, software, firmware, or virtually any combination thereof.

While particular aspects and embodiments of the subject matter described herein have been shown and described, it will be apparent to those skilled in the art that, based upon the teachings herein, changes and modifications may be made and, therefore, the appended claims are to encompass within their scope all such changes and modifications as are within the true spirit and scope of the subject matter described herein.

What is claimed is:

1. A method for operating a motorized hoist, the hoist comprising a motor and operable to raise a maintenance platform, said motor having an input for receiving voltage and current representative of motor operation, the method comprising:
   receiving, by a power controller, said voltage and current representative of motor operation and determining an estimated power based on the voltage and current;
   determining, by the power controller, a capacity of said motor to meet motor operating conditions based on a pattern of said current;
   determining, by the power controller, a degree of overload of said motor based on said estimated power; and
   inhibiting, by the power controller, further operation of the hoist as a function of said capacity and said degree, wherein said degree is based on an estimate of power required to elevate the platform, the estimate of power based on a peak of successive half cycles of waveforms of the current and voltage to derive an RMS value of said estimated power as:

$$P = 0.5 * V_{peak-ave} * I_{peak-ave}.$$

2. The method of claim 1, wherein said current is measured using a Hall Effect Device (HED).

3. The method of claim 1, further comprising providing an indication when said capacity or said degree exceeds a predetermined value.

4. The method of claim 1, wherein said estimated power is determined by processing nominally instantaneous samples of said current and said voltage.

5. The method of claim 1, wherein said estimated power is based on successive samples of voltage and current using the formula:

$$P = \frac{1}{N}\sum_{j=0}^{n-1} v(j) * i(j)$$

where n samples are measured per full cycle of said voltage.

6. A system for determining an operating condition of a motorized hoist and controlling operating modes of the hoist, the hoist comprising a motor and operable to raise a maintenance platform, the system comprising:
   means for receiving said voltage and current representative of motor operation and determining an estimated power based on the voltage and current;
   means for determining a capacity of said motor to meet motor operating conditions based on a pattern of said current;
   means for determining a degree of overload of said motor based on said estimated power; and
   means for inhibiting further operation of the hoist as a function of said capacity and said degree, wherein said degree is based on an estimate of power required to raise the maintenance platform, the estimate of power based on a peak of successive half cycles of waveforms of the current and voltage to derive an RMS value of said estimated power as:

$$P = 0.5 * V_{peak-ave} * I_{peak-av}.$$

7. The system of claim 6, further comprising means for providing a warning indication when said capacity and said degree exceeds a predetermined value.

8. The system of claim 6, wherein said estimated power is determined by processing nominally instantaneous samples of said current and said voltage.

9. The system of claim 6, wherein said estimated power is based on successive samples of voltage and current using the formula:

$$P = \frac{1}{N}\sum_{j=0}^{n-1} v(j) * i(j)$$

where n samples are measured per full cycle of said voltage.

10. The system of claim 6, further comprising applying power to said motor by applying voltage to the motor at a zero crossing point of a supply voltage and removing power at a zero current crossing point.

11. The system of claim 6, further comprising means for selecting an operating mode for said motor.

12. The system of claim 6, further comprising means for receiving optical signals and means for determining a command for said motor based on the received optical signal.

13. The system of claim 6, further comprising means for sensing temperature and means for determining an estimated current through said motor based on a time rate of change of temperature at said motor.

14. A method for operating a motorized hoist, the hoist comprising a motor and operable to raise a maintenance platform, said motor having an input for receiving voltage and current representative of motor operation, the method comprising:
    receiving said voltage and current representative of motor operation and determining an estimated power based on the voltage and current;
    determining a capacity of said motor to meet motor operating conditions based on a pattern of said current;
    determining a degree of overload of said motor based on said estimated power; and
    inhibiting further operation of the hoist as a function of said capacity and said degree, wherein said inhibiting comprises determining that said motor can develop torque sufficient to reach a speed above a start condition for said motor and the degree of overload exceeds a predetermined level.

15. A method for operating a motorized hoist, the hoist comprising a motor and operable to raise a maintenance platform, said motor having an input for receiving voltage and current representative of motor operation, the method comprising:
    receiving said voltage and current representative of motor operation and determining an estimated power based on the voltage and current;
    determining a capacity of said motor to meet motor operating conditions based on a pattern of said current;
    determining a degree of overload of said motor based on said estimated power; and
    inhibiting further operation of the hoist as a function of said capacity and said degree, wherein said inhibiting comprises determining that said motor can develop torque sufficient to reach a speed above a start condition for said motor and the voltage is below a predetermined level.

16. A system for determining an operating condition of a motorized hoist and controlling operating modes of the hoist, the hoist comprising a motor and operable to raise a maintenance platform, the system comprising:
    means for receiving said voltage and current representative of motor operation and determining an estimated power based on the voltage and current;
    means for determining a capacity of said motor to meet motor operating conditions based on a pattern of said current;
    means for determining a degree of overload of said motor based on said estimated power;
    means for inhibiting further operation of the hoist as a function of said capacity and said degree; and
    means for detecting a stalled or locked motor condition when the platform load exceeds a rated capacity of said motor.

17. A system for determining an operating condition of a motorized hoist and controlling operating modes of the hoist, the hoist comprising a motor and operable to raise a maintenance platform, the system comprising:
    means for receiving said voltage and current representative of motor operation and determining an estimated power based on the voltage and current;
    means for determining a capacity of said motor to meet motor operating conditions based on a pattern of said current;
    means for determining a degree of overload of said motor based on said estimated power;
    means for inhibiting further operation of the hoist as a function of said capacity and said degree; and
    means for detecting a stalled or locked motor condition when said voltage is lower than a predetermined level.

18. A system for determining an operating condition of a motorized hoist and controlling operating modes of the hoist, the hoist comprising a motor and operable to raise a maintenance platform, the system comprising:
    means for receiving said voltage and current representative of motor operation and determining an estimated power based on the voltage and current;
    means for determining a capacity of said motor to meet motor operating conditions based on a pattern of said current;
    means for determining a degree of overload of said motor based on said estimated power; and
    means for inhibiting further operation of the hoist as a function of said capacity and said degree, wherein said inhibiting comprises means for determining that said motor can develop torque sufficient to reach a speed above a start condition for said motor and the degree of overload exceeds a predetermined level.

19. A system for determining an operating condition of a motorized hoist and controlling operating modes of the hoist, the hoist comprising a motor and operable to raise a maintenance platform, the system comprising:
    means for receiving said voltage and current representative of motor operation and determining an estimated power based on the voltage and current;
    means for determining a capacity of said motor to meet motor operating conditions based on a pattern of said current;
    means for determining a degree of overload of said motor based on said estimated power; and
    means for inhibiting further operation of the hoist as a function of said capacity and said degree, wherein said inhibiting comprises means for determining that said motor can develop torque sufficient to reach a speed above a start condition for said motor and the voltage is below a predetermined level.

\* \* \* \* \*